United States Patent [19]

Kadota et al.

[11] Patent Number: 4,980,305
[45] Date of Patent: Dec. 25, 1990

[54] METHOD OF MANUFACTURING BIPOLAR TRANSISTOR

[75] Inventors: Yasuo Kadota; Junzoh Shimizu, both of Tokyo, Japan

[73] Assignee: NEC Corporation, Japan

[21] Appl. No.: 372,424

[22] Filed: Jun. 26, 1989

[30] Foreign Application Priority Data

Jun. 27, 1988 [JP] Japan .................. 63-159660

[51] Int. Cl.⁵ .......................... H01L 21/331
[52] U.S. Cl. ........................ 437/31; 437/33; 437/64; 437/72; 437/193; 437/909; 437/67; 148/DIG. 11
[58] Field of Search ............ 437/31, 32, 33, 61, 437/62, 63, 64, 69, 70, 72, 67, 193, 203, 909; 148/DIG. 10, DIG. 11

[56] References Cited

U.S. PATENT DOCUMENTS

| | | | |
|---|---|---|---|
| 4,460,417 | 7/1984 | Murase et al. | 437/162 |
| 4,483,726 | 11/1984 | Isaac et al. | 437/162 |
| 4,507,171 | 3/1985 | Bhatia et al. | 437/162 |
| 4,531,282 | 7/1985 | Sakai et al. | 437/162 |
| 4,745,087 | 5/1988 | Iranmanesh | 437/203 |
| 4,746,629 | 5/1988 | Hanagasaki | 437/162 |
| 4,780,427 | 10/1988 | Sakai et al. | 437/46 |

FOREIGN PATENT DOCUMENTS

0141767 6/1987 Japan .................. 437/61

Primary Examiner—Brian E. Hearn
Assistant Examiner—Tuan Nguyen
Attorney, Agent, or Firm—Laff, Whitesel, Conte & Saret

[57] ABSTRACT

A bipolar transistor in which a base region and a collector lead-out portion is separated is disclosed. The base region and an active collector portion under the base region is surrounded by a narrow trench filling an insulating film, and the trench is in turn surrounded by the collector lead-out portion. A collector electrode is contacted to the upper surface of the collector lead-out portion such that the collector contact surrounds the active collector portion via the trench, in the plan view.

4 Claims, 7 Drawing Sheets

METHOD OF MANUFACTURING BIPOLAR TRANSISTOR

BACKGROUND OF THE INVENTION

1. Field of the Invention

The present invention relates to a bipolar transistor and a method of manufacturing the same, and more particularly, to a bipolar transistor in which the collector lead-out portion and the base region is separated by an embedded isolating layer.

2. Description of the Related Art

In a typical conventional bipolar transistor, the base region is surrounded by and contacted at its side to a silicon oxide layer, and the base lead-out electrode made of polycrystalline silicon is connected to the periphery of the base region. Therefore, the area required by the base region is reduced and the junction capacitance between the base and collector can be reduced so that excellent high frequency characteristics can be obtained. However, the transistor has a large collector resistance because the collector region under the base region is led-out through the buried layer to the collector lead-out portion in only one direction and the silicon oxide layer between the base region and the collector lead-out portion has a wide width resulting in a long collector path. Consequently, high-speed operations of the transistor is not obtained.

SUMMARY OF THE INVENTION

Accordingly, it is one object of the present invention to provide an improved bipolar transistor which realizes high-speed operations by reducing the collector resistance.

Another object of the present invention is to provide an effective method of manufacturing the improved bipolar transistor.

According to one feature of the present invention, there is provided a bipolar transistor which comprises a semiconductor substrate having a major surface and a transistor forming section of a first conductivity type surrounded by a field insulating layer, a trench formed in the transistor forming section from the major surface inwardly up to a first depth, the trench surrounding a first portion of the transistor forming section and being surrounded by a second portion of the transistor forming section positioned between the trench and the field insulating layer, an insulating film filling the trench, a first impurity region of a second conductivity type opposite to the first conductivity type formed in the first portion from the major surface up to a second depth shallower than the first depth such that a part of the first portion under the first impurity region remains as of the first conductivity type and that the side of the first impurity region is entirely contacted to the insulating film filling the trench; a second impurity region of the first conductivity type formed at a center part of the first impurity region from the major surface up to a third depth shallower than the second depth; a collector electrode contacted to the major surface of the second portion of the transistor forming section and surrounding the trench and the part of the first portion under the first impurity region, in the plan view, a base electrode contacted to a periphery part of the first impurity region, and an emitter electrode contacted to the second impurity region, whereby, the part of the first portion under the first impurity region is an active collector portion of a collector of the transistor; the second portion is a collector lead-out portion of the collector; the first impurity region is a base of the transistor; and the second impurity region is an emitter of the transistor.

A plurality of transistors such as input transistors of an ECL circuit may be formed in one transistor forming section in common such that respective transistors including the active collector portions, bases and emitters are surrounded by respective trenches of the present invention, and the respective trenches are in turn surrounded by a common collector lead-out portion to which a common collector electrode is contacted.

The depth of the trench must be deeper than the base region, and the aspect ratio (depth/width) of 2.0 or less is favorable for forming precisely the trench. Therefore, the width of the trench ranges preferably from 0.2 $\mu$m to 0.5 $\mu$m from practical point of view. Generally, the collector lead-out portion has a higher impurity concentration than the active collector portion. Further, a buried layer of high impurity concentration may be formed under the transistor forming section of epitaxial silicon layer, that is, under the active collector portion and collector lead-out portion. If the epitaxial silicon layer is relatively thick and the base is relatively shallow, the trench may be not reached to the buried layer. To the contrary, if the epitaxial silicon layer is relatively thin and the base is relatively deep, the trench may be reached to the buried layer. In the former case, the collector current flows between the active collector portion and the collector electrode through the collector lead-out portion, a part of the epitaxial layer under the bottom of the trench and the buried layer, and in the latter case, through the collector lead-out portion and the buried layer. In both cases, the collector resistance ($R_{SC}$) can be smaller than a prior art structure by about 30% because the collector current of the present invention is lead-out in all directions and the width of the trench is small.

Further, when the present invention is adopted at an integrated circuit semiconductor device forming a plurality of transistors. To realize a high integration density, these transistors can be formed in one transistor forming section surrounded by the field insulating layer without producing unfavorable parasitic transistor action. Consequently, the collector-substrate capacitance which is defined by the area of the buried layer can be reduced comparing to a prior art device. In addition to the advantage of the low collector resistance, the advantage of the low collector-substrate capacitance can further enhance the operation speeds and can obtain better high-frequency characteristics.

The bipolar transistor mentioned above can be manufactured by a method of the present invention. The method comprises the steps of; preparing a semiconductor substrate including a silicon body of a first conductivity type, a epitaxial silicon layer of a second conductivity type opposite to the first conductivity type formed on the silicon body and having an upper surface, a buried layer of the second conductivity type formed between the epitaxial silicon layer and the silicon body and having an impurity concentration higher than that of the epitaxial silicon layer, and a field insulating layer surrounding the epitaxial silicon layer, formed on the silicon body and reaching the periphery of the buried layer; forming a polycrystalline silicon pattern on the upper surface of the epitaxial silicon layer entirely and on the field insulating layer near the epitaxial silicon layer selectively; forming a covering layer entirely on the polycrystalline silicon pattern and on the field insulating layer; forming an opening in the covering layer and in the polycrystalline silicon pattern to expose a center section of the epitaxial silicon layer such that the exposed center section is surrounded by a peripheral section of the epitaxial silicon layer to which the remaining polycrystalline silicon pattern is contacted; forming a side wall layer made of material resistant against oxidation on a peripheral part of the center section and on the side of the opening of the covering layer and polycrystalline silicon pattern such that the side wall surrounds a center part of the exposed center section of the epitaxial silicon layer; carrying out a heat treatment under oxidizing atmosphere to form a silicon oxide film on the exposed center part of the epitaxial silicon layer using the covering layer and side wall as a mask; removing the side wall using the covering layer and silicon oxide film as a mask to expose the peripheral part of the center section of the epitaxial silicon layer; forming a trench in the exposed peripheral part of the epitaxial silicon layer using the covering layer and silicon oxide film as a mask such that the trench surrounds the center part of the epitaxial silicon layer and is surrounded by the peripheral section of epitaxial silicon layer; forming an insulating film in the trench to fill the trench; forming a first impurity region of the first conductivity type as a base of the transistor in the center part surrounded by the trench such that the side of the first impurity region is entirely contacted to the insulating film within the trench; and forming a second impurity region of the second conductivity type as an emitter of the transistor in the first impurity region; whereby, a section of the center part of the epitaxial silicon layer under the first impurity region and surrounded by the trench is an active collector portion of a collector of the transistor, and the peripheral section of the epitaxial silicon layer surrounding the trench is a collector lead-out portion of the collector, and the polycrystalline silicon pattern contacted to the entire surface of the collector lead-out portion and surrounding the active collector portion, in the plan view, is a collector electrode of said transistor. The covering layer may include a silicon nitride film and a silicon oxide film formed on the silicon nitride film, and the side wall may be made of silicon nitride. The side wall can be formed by conducting anisotropic etching to a silicon nitride film formed entirely on the exposed center section of the epitaxial layer and on the covering layer.

DESCRIPTION OF A PRIOR ART

Figure 1:
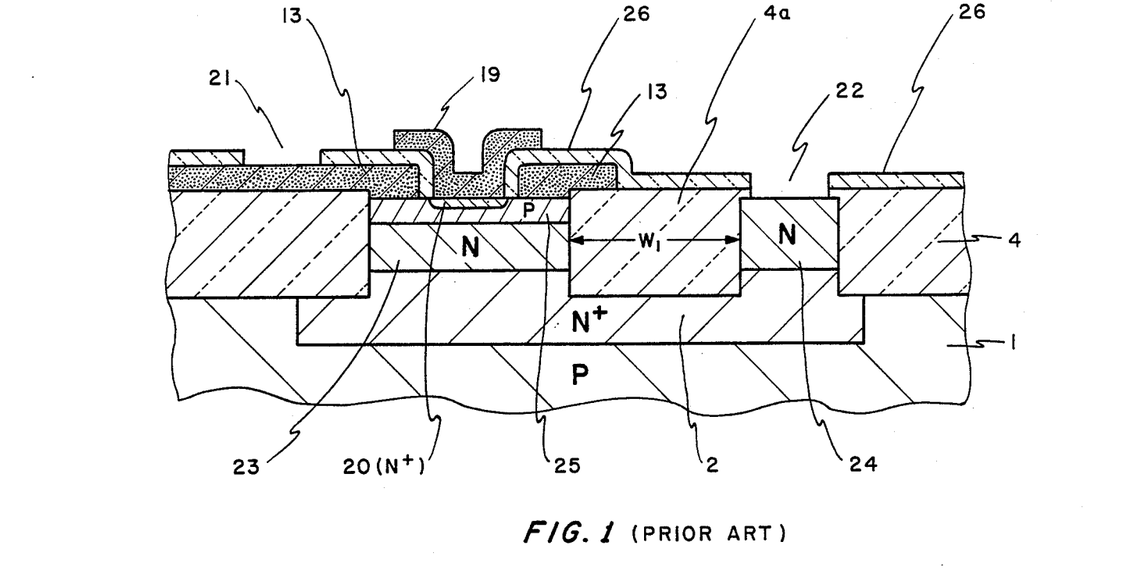
FIG. 1 is a cross-sectional view showing a bipolar transistor in a prior art.

Referring to FIG. 1, an N+-type buried layer 2 is provided on a major surface of a P-type silicon body 1 and an N-type epitaxial layer is formed on the surface including the N+-type buried layer 2. Next, the epitaxial layer is subjected to selective oxidation to selectively form a thick field silicon oxide layer 4 for element isolation and a silicon oxide layer 4a for electrode isolation, which reaches the buried layer 2, thereby defining an element forming region, together with an active collector portion 23 and a collector lead-out portion 24. Next, a P-type base region 25 is formed on the surface of the active collector portion 23 and a polycrystalline silicon layer 13 which contains a P-type impurity and connects with the base region 25 is selectively formed on the surface including the base region 25 to form a base electrode. Next, an opening is formed in the polycrystalline silicon layer 13 to expose a part of the surface of the base region 25. Next, an insulating film 26 is formed on the surface including the opening, and only a portion of the insulating film 26 which is located at the bottom of the opening is selectively removed. An N-type emitter region 20 is formed on the surface of the base region 25, and a polycrystalline silicon layer 19 which contains an N-type impurity and connects with the emitter region 20 is selectively formed. Next, an opening 21 for contact with the base electrode is formed in the insulating film 26 on the polycrystalline silicon layer 13, while an opening 22 for contact with the collector lead-out portion 24 is formed in the insulating film 26 above the collector lead-out portion 24. The collector lead-out portion 24 to which a collector electrode (not shown) is connected is provided only in one direction (only right side in FIG. 1) from the active collector portion 23. Further, the width $W_1$ of the silicon oxide layer 4a becomes long, for example, of 2.0 μm or more because it is formed by the selective oxidation of the epitaxial layer. Even if a conventional trench method using a photo-resist patterning technology is employed for forming the silicon oxide layer 4a, the width $W_1$ of less than 1.0 μm is practically impossible. Therefore, an unfavorable large collector resistance between the active collector portion 23 and a collector electrode through the collector lead-out portion 24 is inevitable.

DETAILED DESCRIPTION OF EMBODIMENTS OF THE PRESENT INVENTION

Figure 2A:
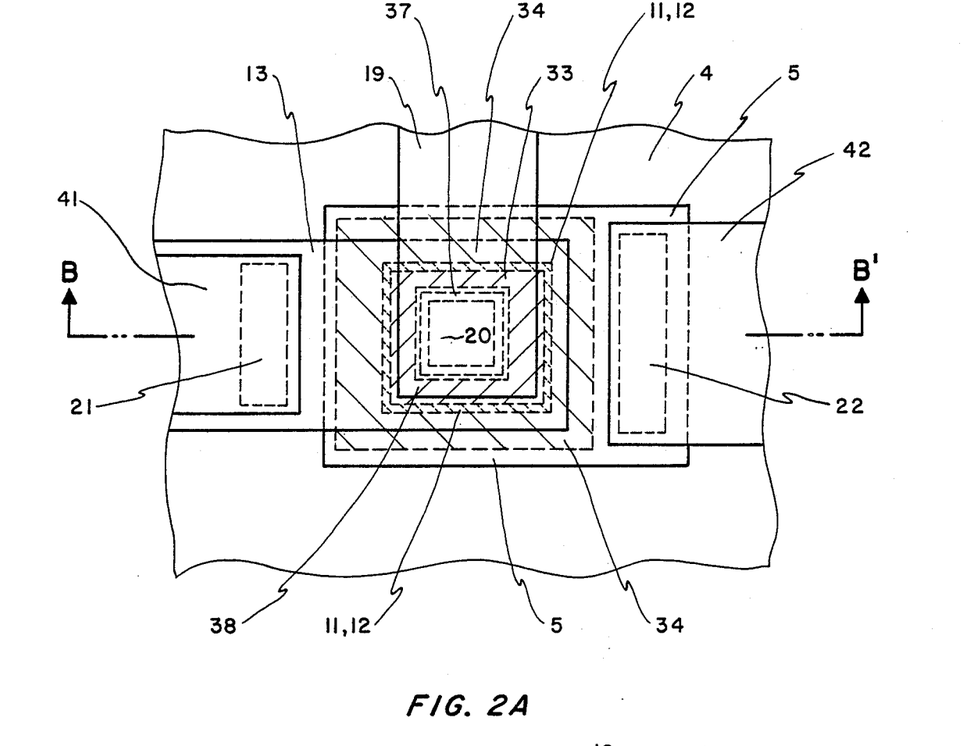
FIG. 2A is a plan view showing a bipolar transistor according to a first embodiment of the present invention.
Figure 2B:
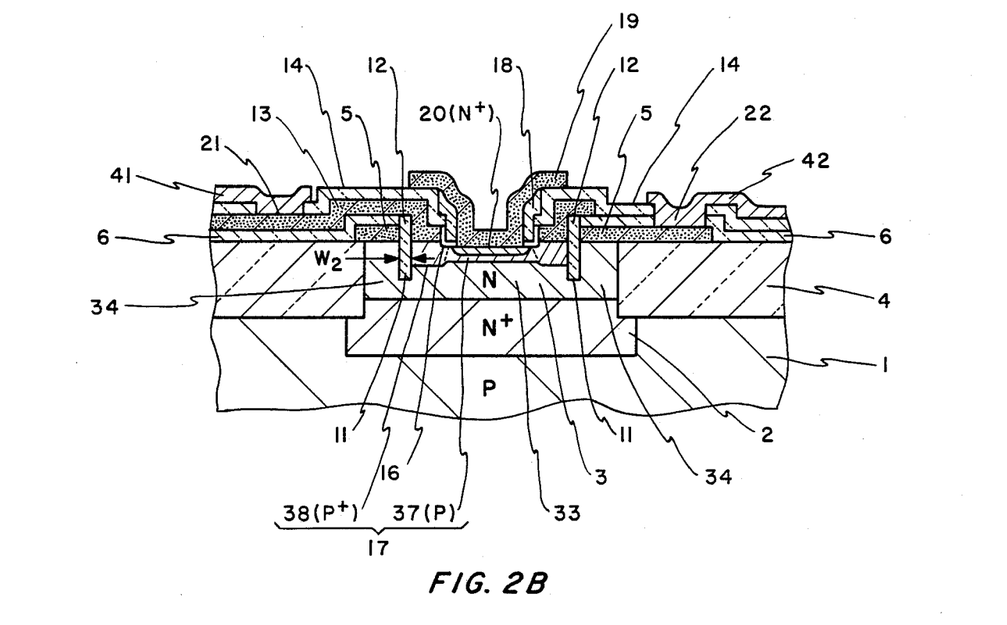
FIG. 2B is a cross-sectional view taken along line B—B' in FIG. 2A as viewed in the direction of arrows.

Referring to FIGS. 2A and 2B, the first embodiment of the present invention will be explained. An N-type epitaxial silicon layer 3 is formed on a P-type silicon body 1 and an N+-type buried layer 2 having an impurity concentration higher than the N-type epitaxial silicon layer 3 is provided between the silicon layer 3 and the silicon body 1. A thick field silicon oxide layer 4 is formed on the silicon body 1 and surrounds the epitaxial silicon layer 3 which is a transistor forming section. Further, the field silicon oxide layer 4 is contacted to peripheral sections of the buried layer 2. In the epitaxial transistor forming section 3, a trench 11 having a ring-like plan shape and a narrow width $W_2$ of 0.2 μm to 0.5 μm is formed from the upper surface inwardly, and an insulating film 12 such as silicon nitride film fills the trench 11 completely. The ring-like trench 11 is represented by left-upward dotted lines hatching in FIG. 2A. A base region 17, which includes a P-type intrinsic base portion (active base portion) 37 and a P+-type extrinsic base portion (graft base portion) 38 having an impurity concentration higher than the intrinsic base portion 37 and surrounding the intrinsic base portion, is formed inside the trench 11 such that the outer side of the extrinsic base portion 38 is entirely contacted to the trench 11, that is, to the insulating film 12 filling the trench and that a part of N-type conductivity type remains under the base region 17. The N-type part under the base region 17 and surrounded by the trench 11 is an active collector portion 33 of the collector region of the transistor and the N-type portion outside the trench 11 so as to surround the trench is a collector lead-out portion 34 of the collector region. The collector lead-out portion 34 may have an impurity concentration of $N^+$-type higher than the active collector portion 33. A collector electrode 5 of N-type polycrystalline silicon is contacted to the entire upper surface of the collector lead-out portion 34 and extends on the field silicon oxide layer 4. The collector lead-out portion 34 surrounds the active collector portion 33 via the trench 11, and therefore, the contact of the upper surface of the collector lead-out portion 34 and the collector electrode 5 also surrounds the active collector portion 33 in the plan view. The collector contact is represented by left-upward solid lines hatching in FIG. 2A. A base electrode 13 of P-type polycrystalline silicon is contacted to the graft base portion 38 and formed on upper parts of the insulating film 12 extending up from the trench 11 and on an insulating film 6 of silicon nitride film. The base contact is represented by right-upward solid lines hatching in FIG. 2A. An $N^+$-type emitter region 20 is formed in the P-type intrinsic base portion 37, and an emitter electrode 19 of N-type polycrystalline silicon is contacted to the emitter region 20 and formed on a thin oxide silicon film 16, on an insulating film 18 of silicon nitride film and on an insulating film 14 of silicon nitride film. An aluminum wiring 42 is connected to the collector electrode 5 through a contact hole 22 formed in the insulating films 6, 14, and also an aluminum wiring 14 is connected to the base electrode 13 through a contact hole 21 formed in the insulating film 14.

According to the present invention embodiment, the collector lead-out portion 34 surrounds the active collector portion 33 via the trench 11 and the collector electrode 5 is contacted to the entire upper surface of the collector lead-out portion. Further, the width $W_2$ of the trench 11 is very narrow. Therefore, the collector resistance of the transistor is extremely reduced, and high operations of the transistor can be obtained.

Referring to FIGS. 3A to 3H, process steps for manufacturing the bipolar transistor shown in FIG. 2 will be explained.

Figure 3A:
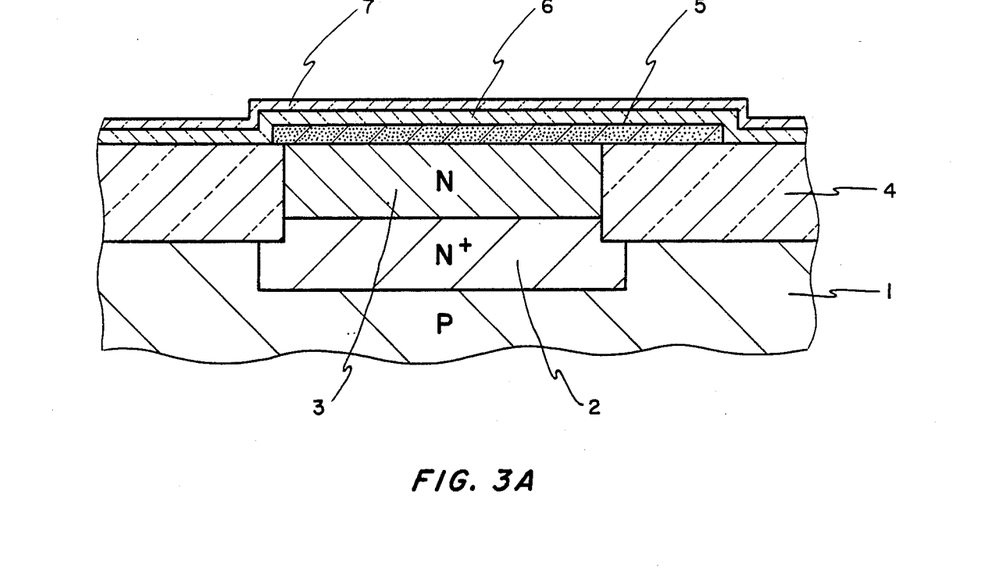
FIGS. 3A to 3H are cross-sectional views showing process steps in sequence for manufacturing the first embodiment shown in FIG. 2.

First, as shown in FIG. 3A, an $N^+$-type buried layer 2 is provided on a principal surface of a P-type silicon body 1, and an N-type epitaxial layer 3 for forming a collector region is grown to a thickness of from 0.5 to 1.0 $\mu$m on the surface including the $N^+$-type buried layer 2. Next, a thick field silicon oxide layer 4 for element isolation, that is, transistor isolation is selectively formed by selective oxidation method to define a transistor forming section. Next, an N-type polycrystalline silicon layer 5 which is to become a collector electrode is deposited to a thickness of from 0.2 to 0.3 $\mu$m on the surface including the transistor forming section, and this layer is selectively etched to form a collector electrode which connects with the N-type epitaxial layer 2 in the transistor forming section. Next, a silicon nitride film 6 having a thickness of from 0.2 to 0.3 $\mu$m and a silicon oxide film 7 having a thickness of from 0.2 to 0.3 $\mu$m are successively deposited on the surface including the polycrystalline silicon layer 5.

Figure 3B:
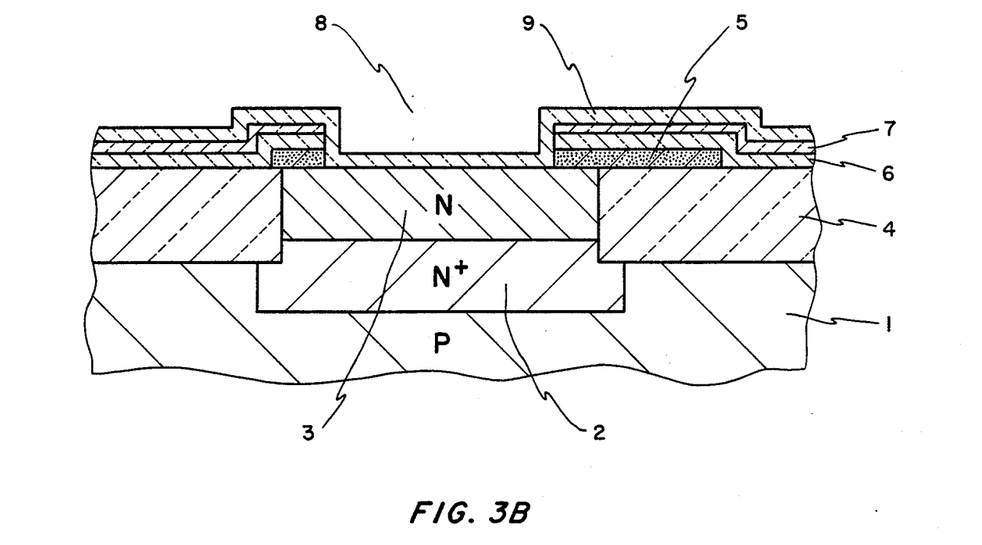

Next, as shown in FIG. 3B, the silicon oxide film 7, the silicon nitride film 6 and the polycrystalline silicon film 5 are selectively removed successively by a lithography technique to form a first opening 8. Next, an oxidation-resistant silicon nitride film 9 is deposited to a thickness of from 0.2 to 0.5 $\mu$m on the surface including the opening 8.

Figure 3C:
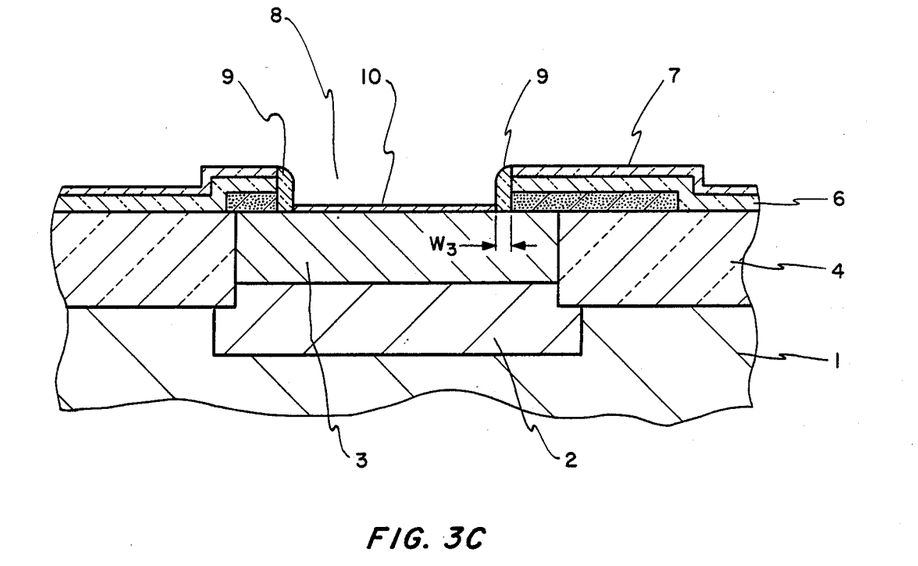

Next, as shown in FIG. 3C, the whole surface is subjected to anisotropic etching by reactive ion etching (hereinafter referred to as "RIE") process to remove the silicon nitride film 9 except for those portions of the film 9 which are left on the vertical inner side surface of the opening 8, thereby exposing the surface of the N-type epitaxial layer 3 in the opening 8. The remaining silicon nitride film is the ring-plan shape side wall 9 having a width $W_3$ ranging from 0.2 $\mu$m to 0.5 $\mu$m. Next, with the silicon oxide film 7 and the silicon nitride film (side wall) 9 used as masks, a silicon oxide film 10 having a thickness of from 0.1 to 0.2 $\mu$m is formed on the surface of the N-type epitaxial layer 3 in the opening 8 by thermal oxidation process.

Figure 3D:
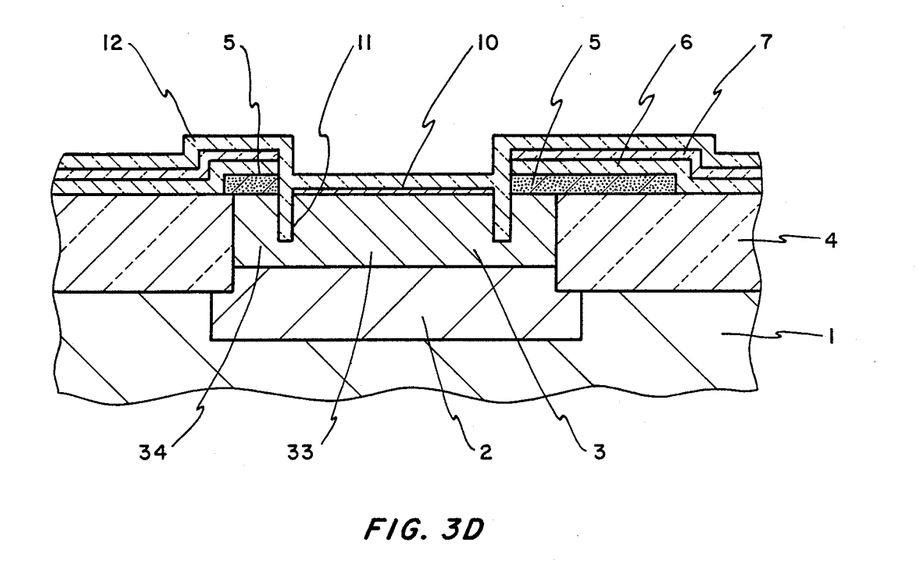

Next, as shown in FIG. 3D, the silicon nitride film 9 is removed with hot phosphoric acid. At this time, the silicon nitride film 6 is not removed since its surface is covered with the silicon oxide film 7. Next, with the silicon oxide films 7 and 10 used as masks, a vertically extending deep trench with a width of 0.3 $\mu$m is formed in the surface of the N-type epitaxial layer 3 by RIE. Next, a silcon nitride film 12 having a thickness of from 0.3 to 0.4 $\mu$m is deposited on the surface including the trench 11 to fill the trench 11.

Figure 3E:
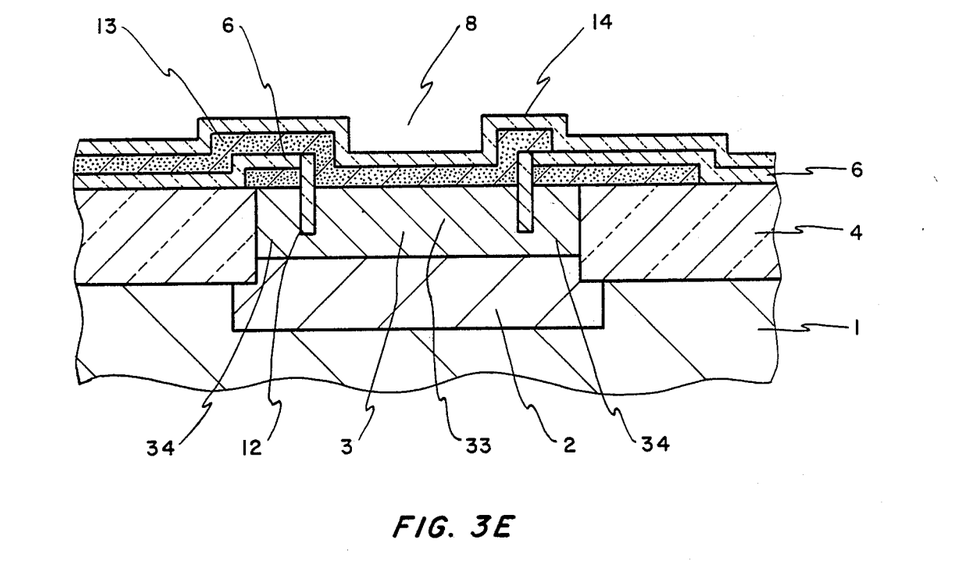

Next, as shown in FIG. 3E, the whole surface is subjected to anisotropic etching by RIE to remove the silicon nitride film 12 except for those of the film 12 which are left in the trench 11 and on the inner walls of the opening 8. Next, a P-type polycrystalline silicon layer 13 is deposited to a thickness of from 0.2 to 0.3 $\mu$m on the surface including the opening 8 and this silicon layer 13 is selectively etched to form a base electrode which connects with the N-type epitaxial layer 3 in the opening 8. Next, a silicon nitride film 14 is deposited on the surface including the polycrystalline silicon layer 13.

Figure 3F:
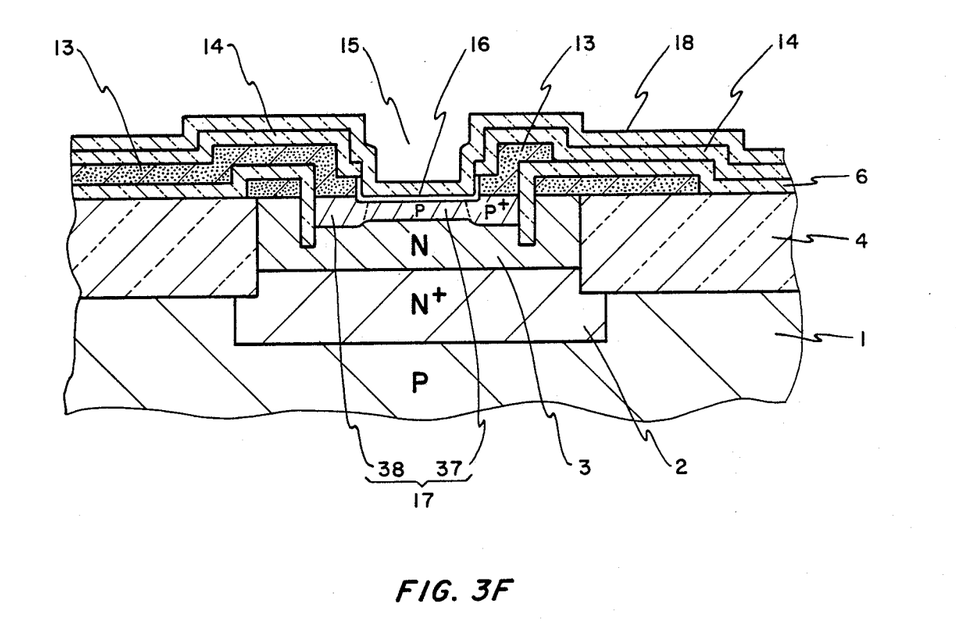

Next, as shown in FIG. 3F, the silicon nitride film 14 and the polycrystalline silicon layer 13 in the opening 8 are selectively etched successively to form a second opening 15 inside the opening 8, thereby exposing the surface of the N-type epitaxial layer 3. Next, a silicon oxide film 16 having a thickness of about 0.1 $\mu$m is formed on the exposed surface of the N-type epitaxial layer 3 and on the side surfaces of the polycrystalline silicon layer 13 by thermal oxidation process, and boron is introduced into the N-type epitaxial layer 3 by ion implantation under conditions of an accelerating energy of from 30 to 40keV and a dosage amount on the order of from $1 \times 10^{13}$ to $2 \times 10^{13}$ cm$^{-2}$ to form an intrinsic (active) base portion 37. Next, a silicon nitride film 18 is deposited to a thickness of 0.3 $\mu$m on the surface including the opening 15. Next, a heat treatment is carried out at 900° C. for 30 minutes to diffuse the boron contained in the P-type polycrystalline silicon layer 13 into the surface of the epitaxial layer 3 thereby forming an extrinsic (graft) base portion 38 which connects with the intrinsic base portion 37.

Figure 3G:
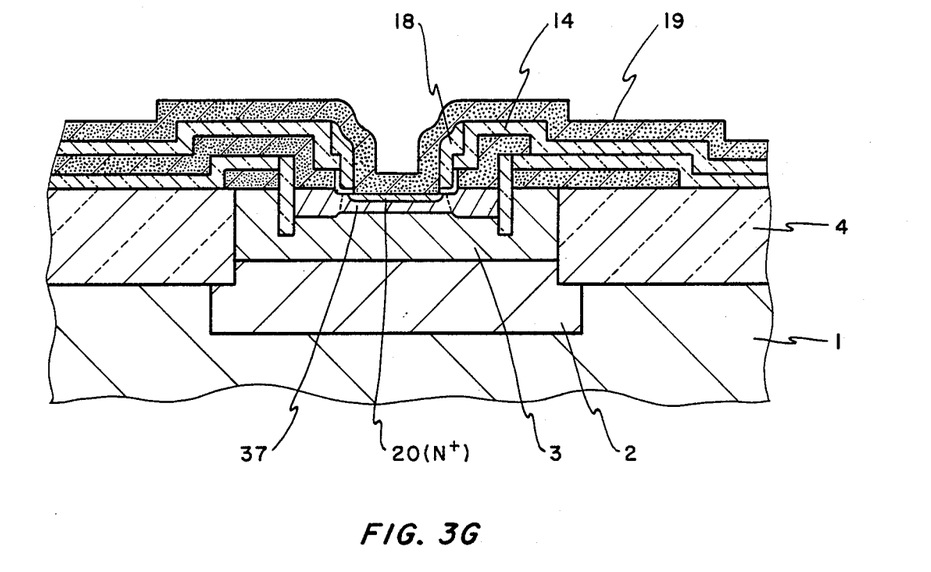

Next, as shown in FIG. 3G, the whole surface is subjected to anisotropic etching by RIE to remove the silicon nitride film 18 except for those portions of the film 18 which are left on the vertical inner side surface of the opening 15, thereby exposing the surface of the intrinsic base portion 37. Next, a non-doped polycrystalline silicon layer 19 is deposited on the surface including the opening 15. Next, arsenic is ion-implanted at a dosage of $1\times10^{16}$ cm$^{-2}$ and a heat treatment is carried out at 950° C. for 20 minutes to form an emitter region 20 in the intrinsic base portion 37.

Figure 3H:
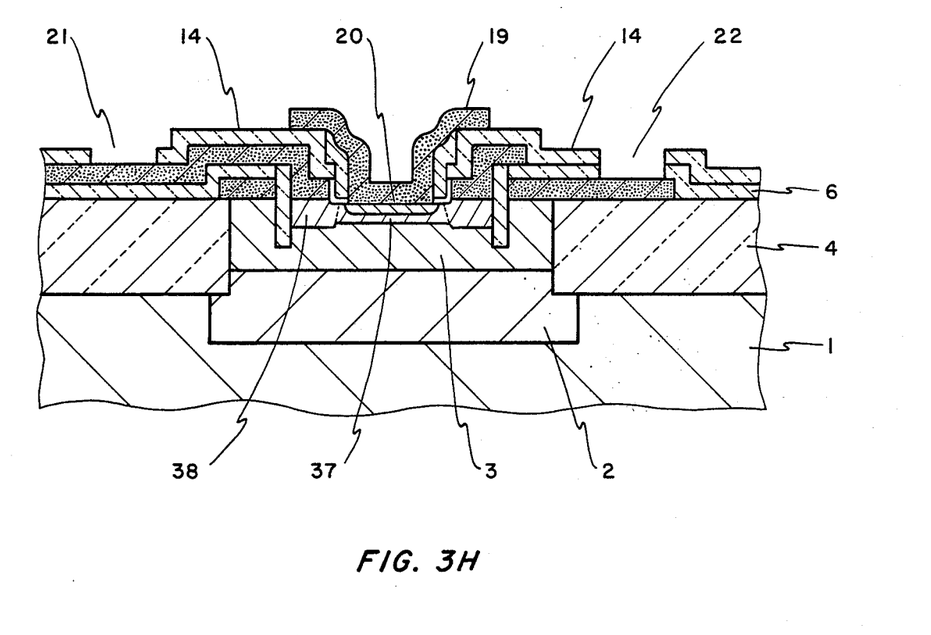

Next, as shown in FIG. 3H, the polycrystalline silicon layer 19 is selectively removed by a photoetching technique to form an emitter electrode. Next, the silicon nitride film 14 is selectively etched to form a contact hole 21 for contact a wiring with the base electrode, and the silicon nitride film 14 and 6 are selectively etched successively to form a contact hole 22 for contact a wiring with the collector electrode, thus completing a bipolar transistor shown in FIG. 2.

It should be noted that, although the embodiment has been concerned an NPN-type bipolar transistor, the invention may similarly be applied to a PNP-type bipolar transistor. In such a case also, the same advantageous effects are obtained.

Figure 4A:
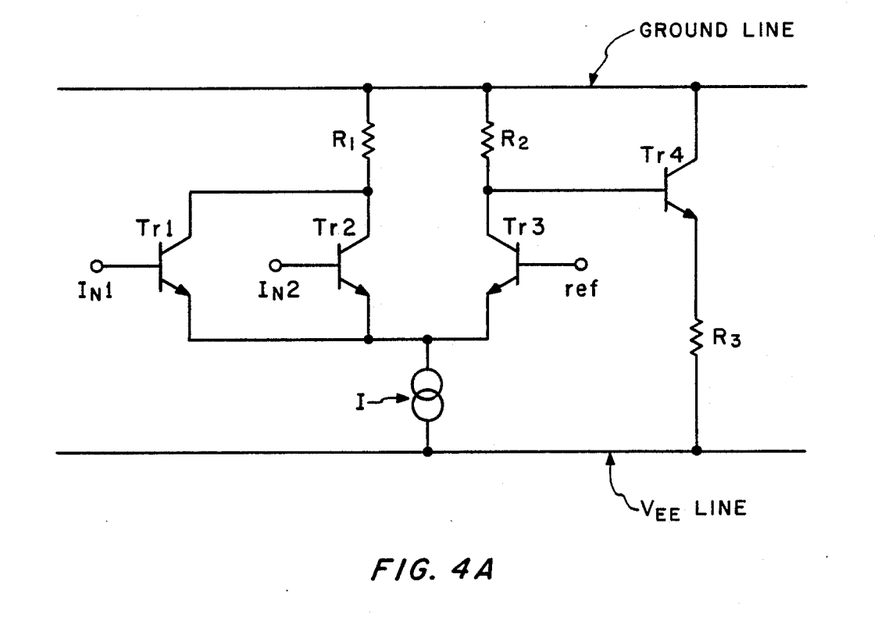
FIG. 4A is a circuit diagram of an integrated circuit semiconductor device which is applicable to a second embodiment of the present invention.
Figure 4B:
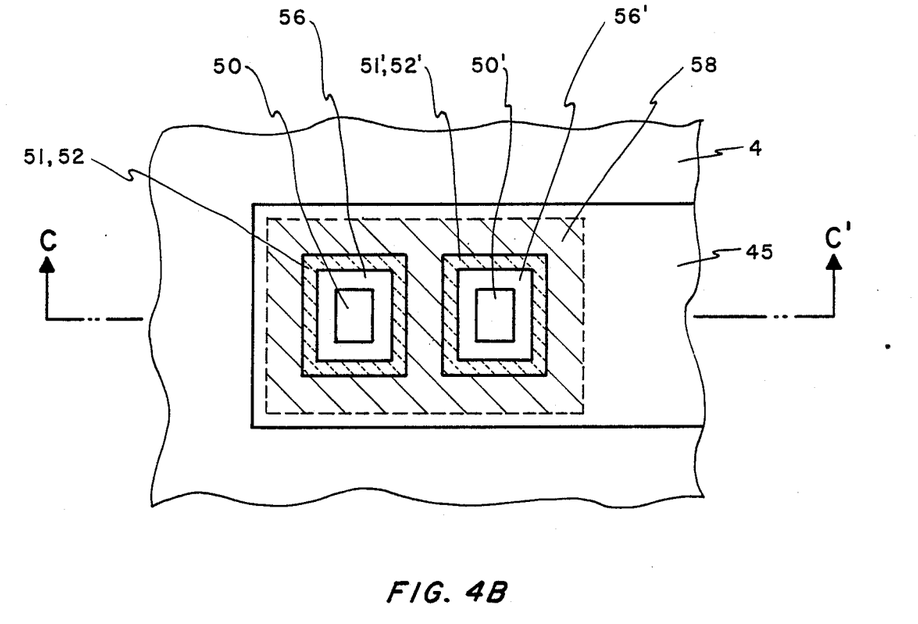
FIG. 4B is a plan view schematically showing parts of the second embodiment.
Figure 4C:
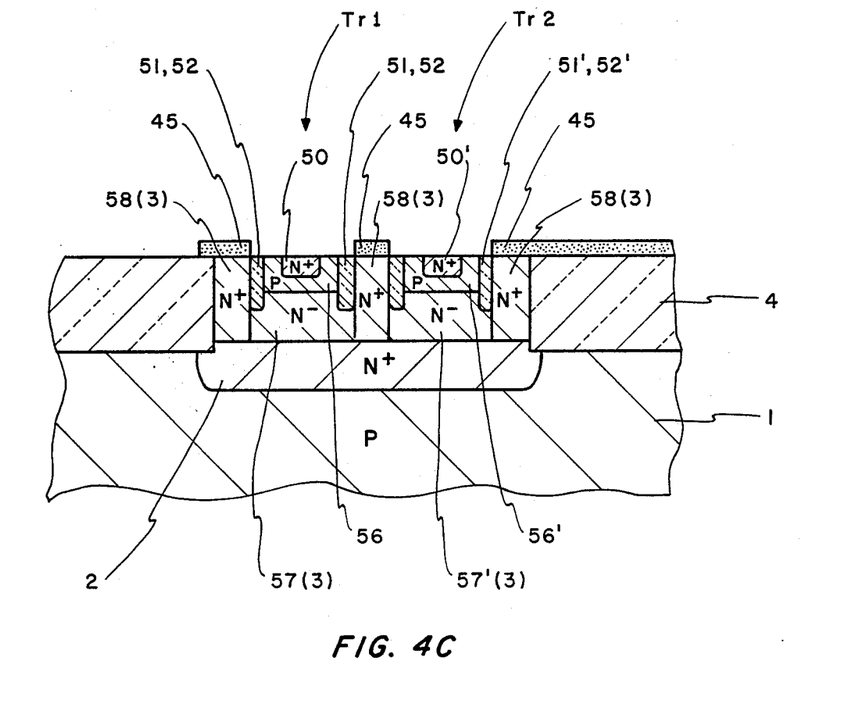
FIg. 4C is a cross-sectional view taken along line C—C' in FIG. 4B as viewed in the direction of arrows.

Referring to FIGS. 4A to 4C, a second embodiment of the present invention will be explained. FIG. 4A shows an ECL circuit connected between a ground line and an negative voltage power source line $V_{EE}$ and including first to fourth bipolar transistors $Tr_1$ to $Tr_4$, first to third resistors $R_1$ to $R_3$ and a constant current source I. First and second input signals $I_{N1}$ and $I_{N2}$ are sent to the bases of the first and second transistors, respectively, and a reference signal $\gamma_{ef}$ is sent to the base of the third transistor $Tr_3$. The collectors of the first and second transistors are connected in common to each other and also the emitters of these transistors are connected in common to each other. Therefore, if the first and second transistors are formed in common in one element forming region of an epitaxial silicon layer surrounded by a field insulating layer, the integration density can be enhanced. However, in this case, an unfavorable parasitic lateral PNP action is apt to occur, and therefore, the common formation is difficult in a prior art.

According to the second embodiment of the present invention, however, the first and second transistors can be formed in one element forming region without occurring the parasitic lateral PNP action, because each of the base regions and each of the active collector portions are surrounded by a trench of the present invention. Further, each of the trenches is in turn surrounded by a common collector lead-out portion to which a common collector electrode is connected at its entire upper surface. Therefore, the collector resistance of each transistor is reduced as in the first embodiment. Moreover, owing to the high integration density, the area of the common buried layer provided under the epitaxial element forming region can be small and the capacitance between the buried layer and the semiconductor body can be reduced. Consequently, operation speeds of the ECL device is further increased.

As shown in FIGS. 4B and 4C, the first transistor $Tr_1$ including a P-type base region 56, an N+-type emitter region 50 and an N−-type active collector portion 57 of a collector region and the second transistor $Tr_2$ including a P-type base region 56', an N+-type emitter region 50' and an N−-type active collector portion 57' of a collector region are formed in common in a common element forming region 3 of silicon epitaxial layer surrounded by a thick field silicon oxide layer 4 which is formed on a P-type silicon body 1. Between the epitaxial element forming region 3 and the silicon body 1, an N+-type common buried layer 2 is formed. The base region 56 and the active collector portion 57 under the base region of the first transistor $Tr_1$ is surrounded by a trench 51 filling with an insulating film 52, and base region 56' and the active collector portion 57' under the base region of the second transistor $Tr_2$ is surrounded by a trench 51' filling with an insulating film 52'. The trench 51 forming the insulating film 52 therein and the trench 51' forming the insulating film 52' therein are represented by left-upward dotted lines hatching in FIG. 4B. Each of the trenches is surrounded by an N+-type common collector lead-out portion 58 such that the portion 58 surrounds each of the active collector portions 57, 57'. A collector electrode 45 of N-type polycrystalline silicon is connected to the entire upper surface of the collector lead-out portion 58 and formed on the field silicon oxide layer 4. The collector contact is represented by left-upward solid lines hatching in FIG. 4B. Other components such as base and emitter electrodes, wirings, insulating films are omitted to show. However, they are the same as of the first embodiment shown in FIG. 2.

What is claimed is:

1. A method of manufacturing a bipolar transistor comprising the steps of;
    preparing a semiconductor substrate including a silicon body of a first conductivity type, an epitaxial silicon layer of a second conductivity type opposite to said first conductivity type formed on said silicon body and having an upper surface, a buried layer of said second conductivity type formed between said epitaxial silicon layer and said silicon body and having an impurity concentration higher than that of said epitaxial silicon layer, and a field insulating layer surrounding said epitaxial silicon layer, formed on said silicon body and reaching the periphery of said buried layer;
    forming a polycrystalline silicon pattern on said upper surface of said epitaxial silicon layer entirely and on said field insulating layer near said epitaxial silicon layer selectively;
    forming a covering layer entirely on said polycrystalline silicon pattern and on said field insulating layer;
    forming an opening in said covering layer and in said polycrystalline silicon pattern to expose a center section of said epitaxial silicon layer such that said exposed center section is surrounded by a peripheral section of said epitaxial silicon layer to which the remaining polycrystalline silicon pattern is contacted;
    forming a side wall layer made of material resistant against oxidation on a peripheral part of said center section and on the side of said opening of said covering layer and polycrystalline silicon pattern such that said side wall surrounds a center part of said exposed center section of said epitaxial silicon layer;
    carrying out a heat treatment under oxidizing atmosphere to form a silicon oxide film on said exposed center part of said epitaxial silicon layer using said covering layer and side wall as a mask;
    removing said side wall using said covering layer and silicon oxide film as a mask to expose said peripheral part of said center section of said epitaxial silicon layer;

forming a trench in said exposed peripheral part of said epitaxial silicon layer using said covering layer and silicon oxide film as a mask such that said trench surrounds said center part of said epitaxial silicon layer and is surrounded by said peripheral section of epitaxial silicon layer;

forming an insulating film in said trench to fill said trench;

forming a first impurity region of said first conductivity type as a base of transistor in said center part surrounded by said trench such that the side of said first impurity region is entirely contacted to said insulating film within said trench; and forming a second impurity region of said second conductivity type as an emitter of said transistor in said first impurity region;

whereby, a section of said center part of said epitaxial silicon layer under said first impurity region and surrounded by said trench is an active collector portion of a collector of said transistor, and said peripheral section and said epitaxial silicon layer surrounding said trench is a collector lead-out portion of said collector, and said polycrystalline silicon pattern contacted to the entire surface of said collector lead-out portion and surrounding said active collector portion, in the plan view, is a collector electrode of said transistor.

2. A method of manufacturing a bipolar transistor of claim 1, in which said covering layer includes a silicon nitride film and a silicon oxide film formed on said silicon nitride film, and said side wall is made of silicon nitride.

3. A method of manufacturing a bipolar transistor of claim 1, in which said side wall is formed by conducting anisotropic etching to a silicon nitride film formed entirely on said exposed center section of said epitaxial silicon layer and on said covering layer.

4. A method of manufacturing a bipolar transistor of claim 1, in which said trench has a width ranging from 0.2 $\mu$m to 0.5 $\mu$m, and a depth deeper than the depth of said first impurity region using as said base.

* * * * *